United States Patent [19]
Lee

[11] Patent Number: 5,276,341
[45] Date of Patent: Jan. 4, 1994

[54] STRUCTURE FOR FABRICATION OF A CCD IMAGE SENSOR

[75] Inventor: Sung M. Lee, Seoul, Rep. of Korea

[73] Assignee: Gold Star Electron Co., Ltd., Chungcheongbuk-do, Rep. of Korea

[21] Appl. No.: 11,110

[22] Filed: Jan. 29, 1993

Related U.S. Application Data

[63] Continuation of Ser. No. 698,700, May 10, 1991, abandoned.

[30] Foreign Application Priority Data

May 11, 1990 [KR] Rep. of Korea ................ 6730/1990

[51] Int. Cl.$^5$ ............................................ H01L 29/796
[52] U.S. Cl. .................................... 257/223; 257/233
[58] Field of Search ................ 357/24; 377/57; 58, 59, 60, 61, 62, 63; 257/223, 229, 230, 233

[56] References Cited

U.S. PATENT DOCUMENTS

| | | | |
|---|---|---|---|
| 4,460,912 | 7/1984 | Takeshita et al. | 357/24 |
| 4,527,182 | 7/1985 | Ishihara et al. | 357/24 LR |
| 4,630,091 | 12/1986 | Kuroda et al. | 357/24 LR |
| 4,672,455 | 6/1987 | Miyatake | 358/213.31 |
| 4,851,890 | 7/1989 | Miyatake | 357/24 |
| 4,951,148 | 8/1990 | Esser et al. | 358/213.18 |
| 4,977,584 | 12/1990 | Kohno et al. | 357/24 LR |

*Primary Examiner*—Gene M. Munson
*Attorney, Agent, or Firm*—Faegre & Benson

[57] ABSTRACT

The present invention relates to a structure and a method for fabrication of a CCD image sensor having a structure that a p-type epitaxial layer is formed on an n-type substrate to reduce a smear noise and an n-type region for controlling an OFD voltage which is disposed between an n-type substrate beneath an n-type photo diode and a p-type epitaxial layer and a p$^+$-type region for reducing the smear phenomenon which is deposed between an n-type substrate beneath an n-type BCCD and a p-type epitaxial layer. According to this improved structure and method, it can be fabricated of a CCD image sensor easily and rapidly and with reduced smear noise.

1 Claim, 7 Drawing Sheets

STRUCTURE FOR FABRICATION OF A CCD IMAGE SENSOR

This is a continuation of copending application(s) Ser. No. 07/698,700 filed on May 10, 1991, now abandoned.

BACKGROUND OF THE INVENTION

The present invention relates to an improved structure and a method for fabrication of a charge coupled device (hereinafter referred to as a CCD) image sensor for reducing a smear noise.

In general, a CCD image sensor has a structure that a p-type well is formed on an n-type substrate and an n-type photo diode and an n-type vertical charge coupled device (hereinafter referred to as a VCCD) are formed on a p-type well at a designated interval and a transfer gate for connecting said n-type photo diode and said n-type VCCD is formed over the surface of the region between them and an n-type buried charge coupled device (hereinafter referred to as a BCCD).

In said CCD image sensor, an n-type VCCD may be substituted for the BCCD or a surface charge coupled device (hereinafter referred to as a SCCD). Now, the SSC is seldom used.

In a CCD image sensor of the aforesaid conventional structure, to reduce the blooming phenomenon appearing on screen, an anti-blooming bias for controlling an over flow drain (hereinafter referred to as OFD) voltage is ordinary applied to the region under said n-type photo diode.

Thus, a designated potential barrier is formed to prevent overflow of a signal stored in potential well.

Previously known methods for controlling an OFD voltage are a horizontal over flow drain (hereinafter referred to as HOFD) method and a vertical over flow drain (hereinafter referred to as VOFD) method.

However, because the HOFD method is a clocking method, the VCCDs corresponding to each photo diode should be arranged in a line. Accordingly the open area of a photo diode is relatively reduced and the fill factor is decreased so that the sensitivity of the CCD image sensor is lowered.

Currently, the VOFD method is used as the method for controlling an OFD voltage. In said VOFD method, a shallow p-type well of a fitting depth is formed under the photo diode region and a deep p-type well of a fitting depth is formed under the other region by implanting ions twice so that an adequate anti-blooming bias is applied.

A structure of a CCD image sensor made by a VOFD method is shown in FIG. 1(a). An n-type epitaxial layer 2 is formed on an n-type subtrate 1 and a shallow p-type well 3 and a deep p-type well 4 is formed on an n-type epitaxial layer 2 by implanting ions twice. An n-type photo diode 5 and an n-type BCCD 6 are formed in the upper region of said shallow p-type well 3 and said deep p-type well 4 respectively. Subsequently, a transfer poly gate 7 for connecting said n-type photo diode 5 and said n-type BCCD and a poly gate electrode 7a for applying a clock signal to said n-type BCCD 6 are formed over the surface of the region between them and said n-type BCCD 6.

As shown in FIG. 1(a), if light is radiated on an n-type photo diode 5 and a signal charge is generated under an n-type photo diode, a signal charge is shifted to an n-type BCCD 6 by a high level signal which is applied to a transfer poly gate 7 and stored under an n-type BCCD 6. At this time, a signal charge is shifted to a BCCD by conventional clocking of a CCD.

FIG. 1(b) shows an electric potential distribution taken along the line a—a' of FIG. 1(a).

However, at the same time, a signal charge generated under said n-type photo diode 5 is drifting between a deep p-type well 4 and an n-type BCCD 6 or is discharged to an n-type substrate 1 and this charge causes the smear phenomenon.

Furthermore, when a shutter voltage which is on the order of 30 V through 40 V is applied to an n-type subtrate 1, this smear charge is discharged to an n-type subtrate 1 by the shutter voltage and the smear phenomenon can be further increased. This is because this shutter voltage is very intense.

In the prior art, to prevent the smear phenomenon a $p^+$-type blocking p-type layer (hereinafter referred to as a BPL) has been formed in a designated region between said n-type BCCD 6 and said deep p-type well 4 by implanting p ions with high energy.

The process for fabrication of a CCD image sensor using $p^+$-type BPL according to the prior art will be described with reference to the accompanying FIG. 2(a) through FIG. 2(f).

First, as shown in FIG. 2(a), an n-type epitaxial layer 2 is formed on an n-type substrate 1 and as shown in FIG. 2(b) p-type ions are implanted onto an n-type epitaxial layer 2 twice to control an OFD voltage and as shown in FIG. 2(c) a shallow p-type well 3 and a deep p-type well 4 of a designated depth are formed by heat treatment which is used for diffusing the implanted p-type ions.

Next, as shown in FIG. 2(d), $p^+$-type BPL 8 is formed in a designated region of said deep n-type well 4 by implanting p-type ions by means of ion implantation apparatus of high energy (about 600 KeV). Thereafter the $p^+$-type BPL 8 prevents the smear phenomenon that signal charge stored in the BCCD is discharged to a substrate by a shutter voltage of a substrate and that a signal charge generated in photo diode is not transfer to said BCCD but is discharged to a substrate.

As shown in FIG. 2(e), an n-type photo diode 5 is formed in a designated portion of the upper region of said shallow p-type well 3 by implanting n-type ions and an n-type BCCD 6 is formed in a deep p-type well 4 which is in the upper region of said $p^+$-type BPL 8 by implanting n-type ions.

At this time, a conventional $p^+$-type thin film 9 is formed in the surface of an n-type photo diode 5.

Next, as shown in FIG. 2(f) a transfer poly gate 7 for connecting said n-type BCCD 6 and a poly gate electrode 7a for applying a clock signal to said n-type BCCD 6 are formed over the surface of the region between them and said N-type BCCD 6. In this process, poly silicon is used for a transfer gate. Metal such as Al instead of poly silicon can be used for it but it is almost out of use due to its undesirable transfer characteristics.

FIG. 3(a) shows a reference diagram to explain the operation of a CCD image sensor fabricated by the above-mentioned process and the operation of a CCD image sensor will be described with reference FIG. 3(a).

Now, if light (λ) is radiated on an n-type photo diode 5, a signal charge is generated in the light signal charge output region 0 which is disposed between said n-type photo diode 5 and a shallow p-type well 3. When a driving signal of high level is applied to a transfer poly gate 7, this signal charge is stored in the signal charge store region Q adjacent to an n-type BCCD 6 through the signal charge transfer channel region P which is disposed between an n-type photo diode 5 and an n-type BCCD 6.

Next, a signal charge stored in said signal charge store region Q is shifted to a horizontal charge coupled device (hereinafter referred to as a HCCD) (not shown) by the conventional clocking operation.

At this time, if a signal charge generated in the light signal charge output region 0 is not passed to the signal charge transfer channel region P but is discharged to the smear signal output region R which is disposed between a deep p-type well 4 and a p+-type BPL 8, the smear phenomenon is generated on screen of a CCD image sensor.

But, as shown in FIG. 3(b) which shows an electric potential distribution taken along the line b—b' of FIG. 3(a), it is hard to discharge a signal charge to the smear signal output region R with high potential barrier of said p+-type BPL 8 and therefore the smear phenomenon is reduced.

Actually, a signal charge which is drifting in an n-type BCCD 6 rather than a smear signal which is discharged to an n-type substrate 1 is further discussed.

In said structure of a CCD image sensor of prior art, a shallow p-type well and a deep p-type well is formed in a flat shape by implanting ions twice to apply an anti-blooming bias but the former can also be formed in a heart.

Now, by forming said p-type well in a flat shape and controlling the impurity concentration of the region under a photo diode and a BCCD when implanting ions, a structure and a method for fabrication of a CCD image sensor which resists the smear phenomenon and controls the OFD voltage has been studied. But they not yet in use due to difficulties with the ion implantation process.

Prior art structures and a methods for fabrication of a CCD image sensor as shown in FIG. 2 have disadvantages as follows.

First, because ion implantion apparatus for forming p+-type BPL is very expensive and the usage of it is restricted, it is not of practical use.

Second, because p-type ions are implanted using high energy of about 600 KeV, defects are caused in the substrate by the implanting ions. Accordingly, because noise may be generated by defects in CCD image sensors of the prior art, the smear phenomenon can be reduced but a high level of process technology to form the p+-type BPL is demanded.

SUMMARY OF THE INVENTION

It is an object of this invention to provide a method for fabrication of a CCD image sensor to shorten and accomplish easily the process.

It is another object to provide an improved structure CCD image sensor to control OFD voltage and to reduce the smear phenomenon.

According to a preferred embodiment of the present invention, there is provided a method for fabrication of a CCD image sensor comprising a step for forming an n-type region to control an OFD voltage and a p-type region to reduce the smear phenomenon at a designated interval on a epitaxial layer by implanting n-type ions and p-type ions of a high impurity concentration and a heat treatment, a step for growing a p-type epitaxial layer of a designated depth over the whole surface, a step for forming an n-type photo diode and an n-type BCCD at a designated interval by implanting n-type ions in wells which is above said n-type region for controlling an OFD voltage and a p+-type region for reducing the smear phenomenon layer respectively, a step for forming a transfer poly gate to connect an n-type photo diode and an n-type BCCD and a poly gate electrode for apply a clock signal to said n-type BCCD over the surface of a region between them and said n-type BCCD.

And, there is provided an improved structure of a CCD image sensor including an n-type photo diode and an n-type BCCD enclosed by a p-type epitaxial layer and a transfer poly gate to connect them, an improvement characterized by an n-type region for controlling an OFD voltage which is disposed between an n-type region for controlling an OFD voltage which is disposed between an n-type substrate beneath an n-type photo diode and a p-type epitaxial layer and a p+-type region for reducing the smear phenomenon which is deposed between an n-type substrate beneath an n-type BCCD and a p-type epitaxial layer, said regions having the designated depth and width and being formed at a designated interval in a horizontal direction.

The above and other related objects and features of the present invention will be apparent from the reading of the following description of the disclosure found in the accompanying drawings and the novelty thereof pointed out in the claims.

DETAILED DESCRIPTION OF THE INVENTION

A method for fabrication of a CCD image sensor according to the present invention will be described in more detail with reference to FIG. 4(a) through FIG. 4(e).

Figure 1A:
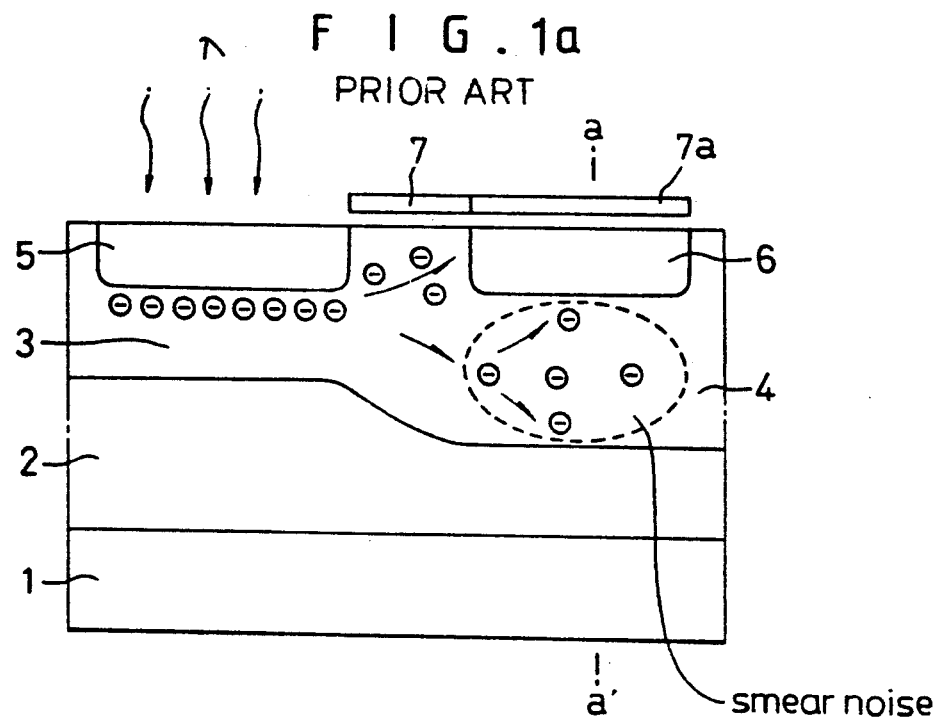
FIG. 1(a) is a cross sectional view of a structure of a CCD image sensor in which reduction of the smear phenomenon is not considered.
Figure 1B:
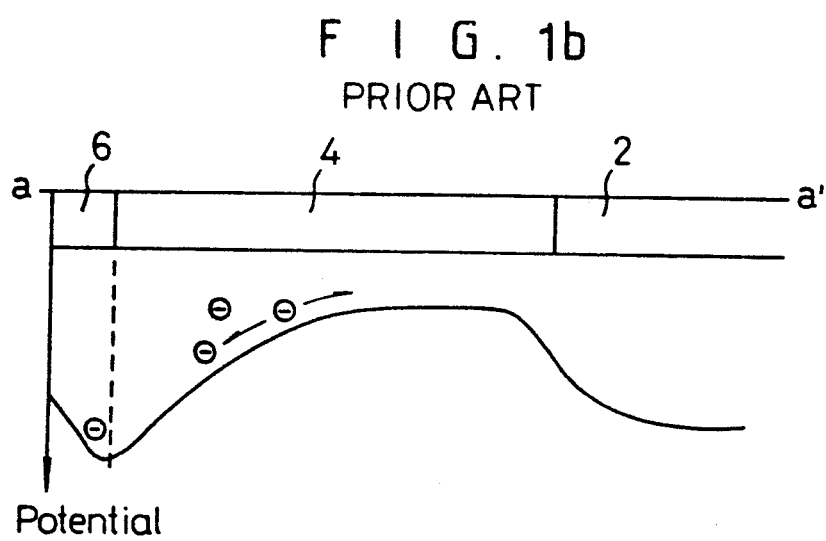
FIG. 1(b) is an electric potential distribution taken along the line a—a' FIG. 1(a).
Figure 2A:
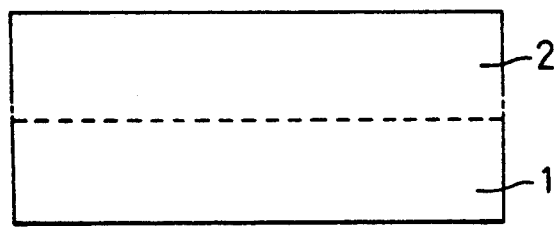
FIG. 2(a) through FIG. 2(f) are cross sectional view to explain a method for fabrication of a CCD image sensor of a prior art in which reduction of the smear phenomenon is considered.
Figure 2B:
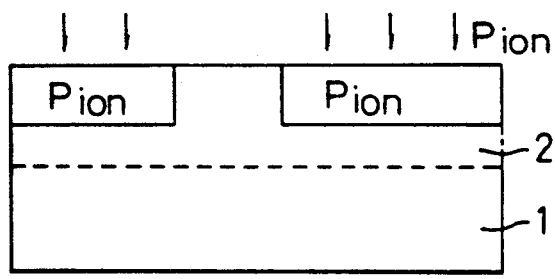
Figure 2C:
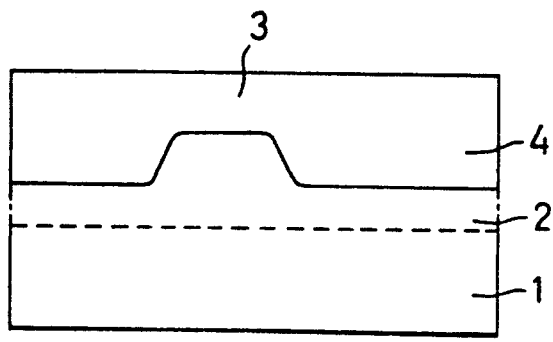
Figure 2D:
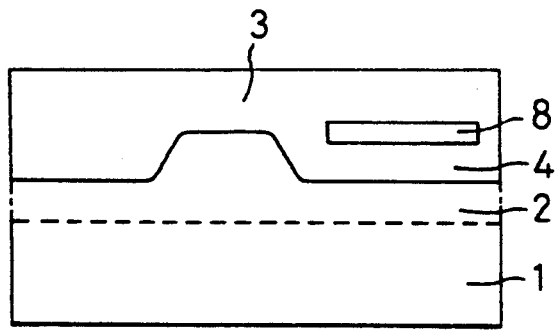
Figure 2E:
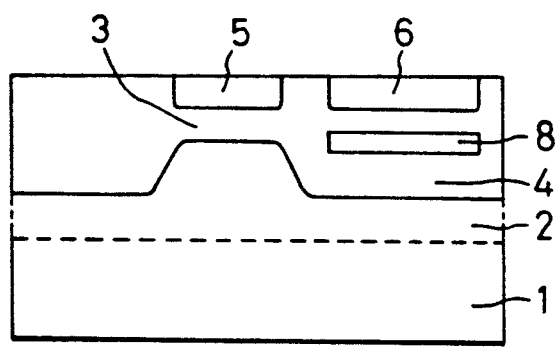
Figure 2F:
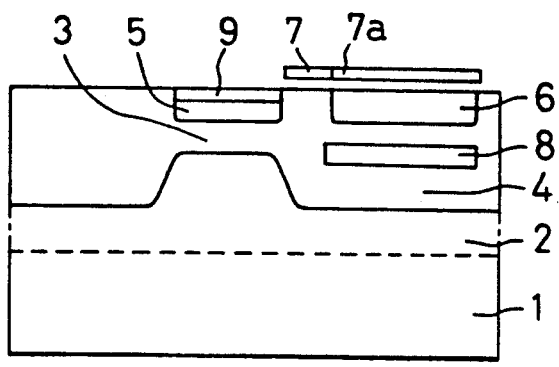
Figure 3A:
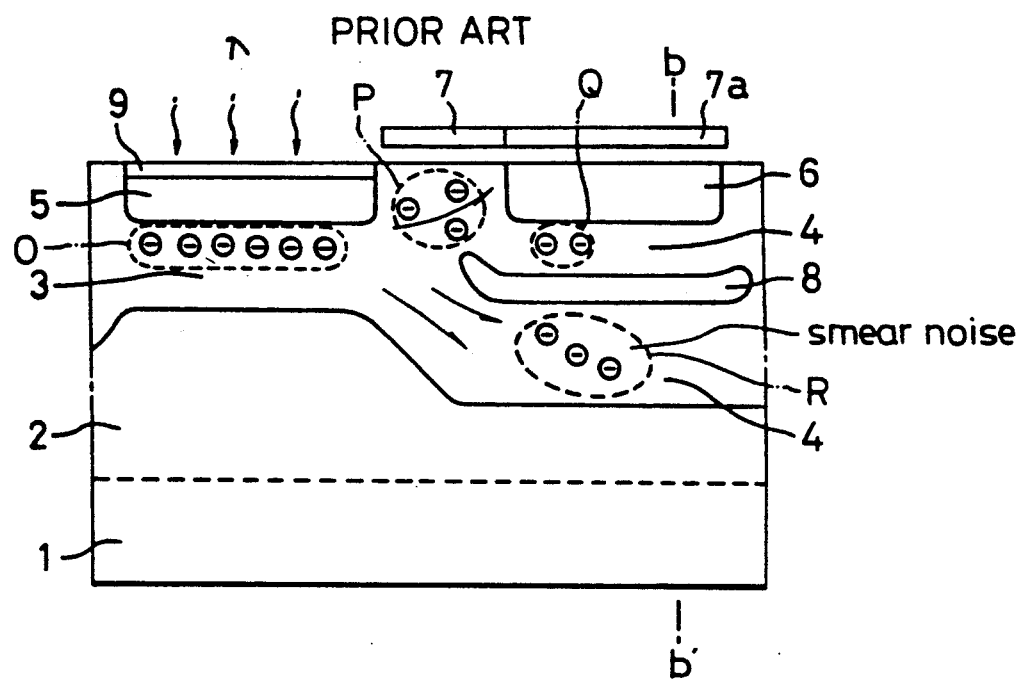
FIG. 3(a) is a reference diagram to explain the operation of CCD image sensor according to a prior art.
Figure 3B:
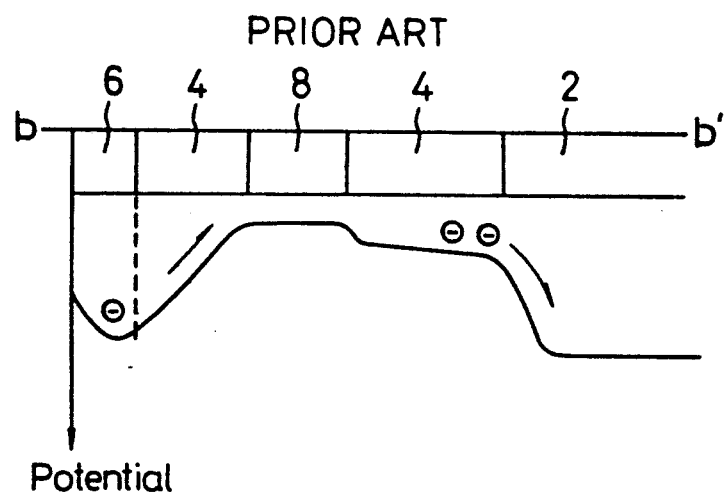
FIG. 3(b) is a electric potential distribution taken along the line b—b' of FIG. 3(a).
Figure 4A:
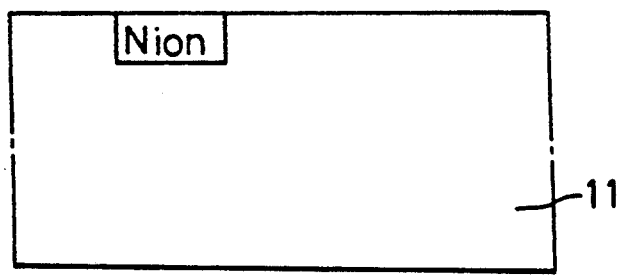
FIG. 4(a) through 4(e) are cross sectional view to explain a method for fabrication of a CCD image sensor according to the present invention in which reduction of the smear phenomenon is considered.
Figure 4B:
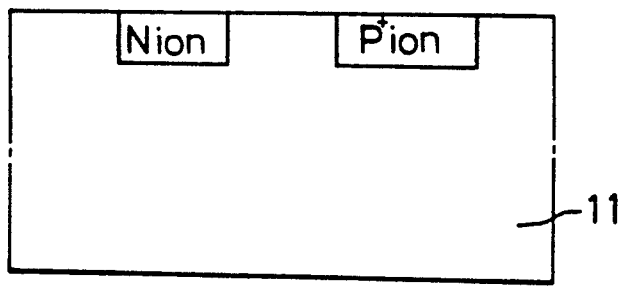

First of all, as shown in FIG. 4(a), n-type ions are implanted in a designated region of an n-type substrate 11 as starting material and as shown in FIG. 4(b) p-type ions are implanted in the region which is displaced from said n-type ion implanted region by a designated interval.

Figure 4C:
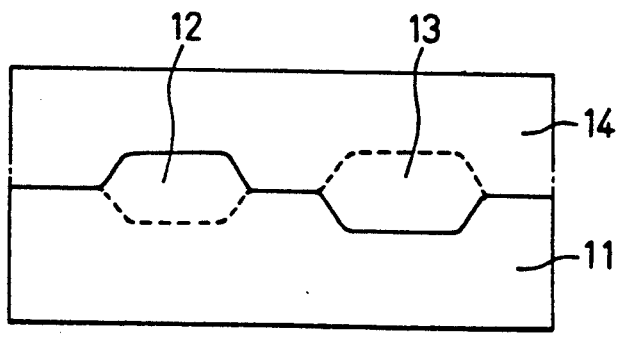

As shown in FIG. 4(c), by diffusing the implanted n-type and p-type ions by means of a heat treatment, an n-type region 12 for controlling an OFD voltage and a p+-type region 13 for reducing the smear phenomenon are formed separated by a designated interval and then a p-type epitaxial layer 14 is formed over the whole surface.

At this time, the designated interval between said n-type region 12 for controlling an OFD voltage and said p+-type region 13 for reducing the smear phenomenon functions as a path to discharge a smear signal to an n-type substrate 11 and said epitaxial layer 14 performs the same function as p-type well 3 and 4 of the prior art CCD image sensor as shown in FIG. 2.

Figure 4D:
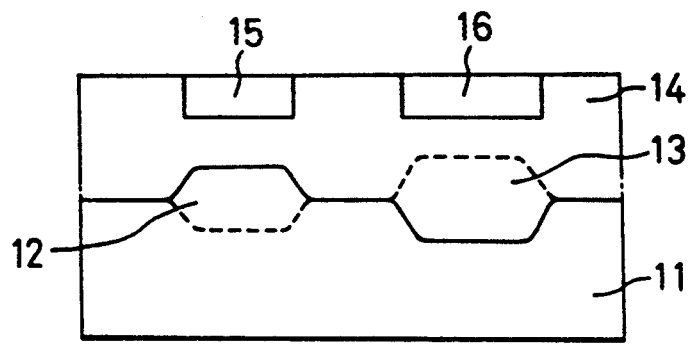

Next, as shown in FIG. 4(d), an n-type photo diode 15 and an n-type BCCD 16 are formed on the surface of a p-type epitaxial layer 14 above said n-type region 12 for controlling an OFD voltage and said p+-type region 13 for reducing the smear phenomenon, respectively.

At this time, p+-type thin film 18 is ordinarily formed in the surface of an n-type photo diode 15.

Figure 4E:
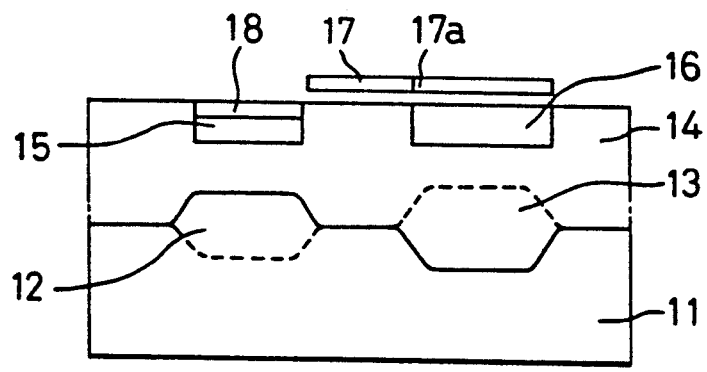

Then, as shown in FIG. 4(e), a transfer poly gate 17 for connecting said n-type photo diode 15 and said n-type BCCD 16 and poly gate electrode 17a for applying a clock signal to said n-type BCCD 16 are formed over the surface of the region between them and said n-type BCCD 16. In this process, poly silicon is used for said transfer poly gate 17, but metal such as Al may also be used.

Figure 5A:
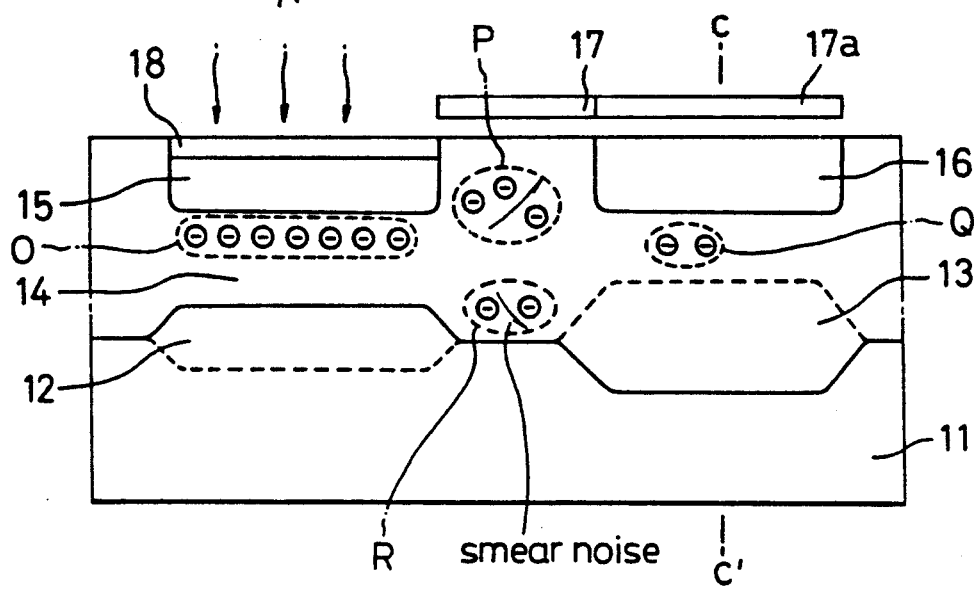
FIG. 5(a) is a reference diagram to explain the operation of a CCD image sensor according to the present invention.

FIG. 5(a) is a reference diagram to explain the operation of a CCD image sensor fabricated by the aforesaid process and the operation of a CCD image sensor will be described with reference to FIG. 5(a).

If light (λ) is radiated on the surface of an n-type photo diode 15, a signal charge is generated in the light signal charge output region O under said n-type photo diode 15. When a high level signal is applied to a transfer poly gate 17, thus turned on, a signal charge is shifted to and stored in the signal charge store region Q under said n-type BCCD 16 through the signal charge transfer channel region P of a p-type epitaxial layer 14.

Then, signal stored in the signal charge store region Q under said n-type BCCD 16 is shifted to a HCCD (not shown) by the operation of CCD clocking.

At this time, a portion of a signal charge generated in the light signal charge output region O is not shifted to the signal charge store region Q through the signal charge transfer channel region P and this signal charge causes a smear phenomenon.

Here, a smear charge being drifting under said n-type BCCD 16 rather than a smear charge discharged to an n-type substrate 11 further affects the quality of the image on the screen.

This is because when a plurality of a CCD image sensors may be combined as a solid state image pick-up device, a smear charge generated in a photo diode is drifting and this charge affects the signal charge generated in other photo diodes.

In the structure of a CCD-type image sensor according to the present invention, with the form of a p+-type region 13 for reducing the smear phenomenon under said n-type BCCD 16 as shown in FIG. 5(a), a higher potential barrier is formed in this region.

Accordingly, a smear charge is not retained in this region and is discharged to n-type substrate 11 through the smear charge output region R where the potential barrier is not present.

Figure 5B:
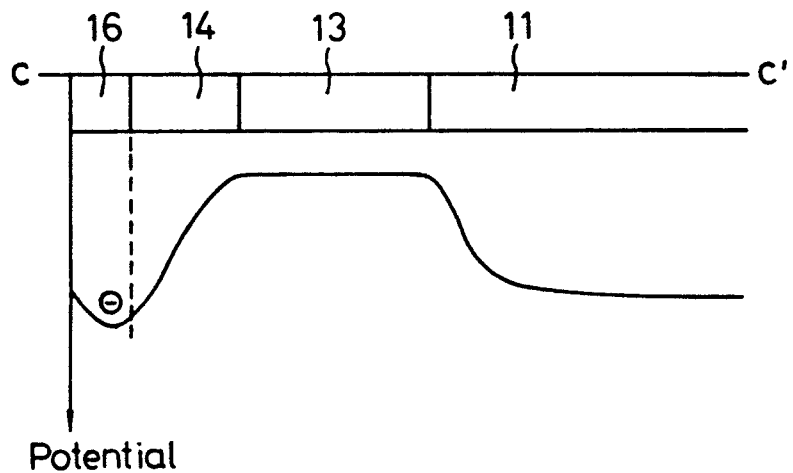
FIG. 5(b) is an electric potential distribution taken along the line c—c' of FIG. 3(F).

FIG. 5(b) shows an electric potential distribution taken along the line c—c' of FIG. 5(a).

As shown in FIG. 5(b), because the higher potential barrier and the wider neutral region are formed in said p+-type region 13 for reducing the smear phenomenon, a smear charge is not retained in this region and is discharged to an n-type substrate 11 through the smear signal output region R. The smear signal output region R is formed in the designated region between said n-type region 12 for controlling an OFD voltage and said p+-type region 12 for controlling an OFD voltage and said p+-type region 13 for reducing the smear phenomenon which has a lower potential barrier.

As the above-mentioned, the benefits of the present invention are as follows.

First, because an expensive ion implantation apparatus and high energy at implanting ions are unnecessary as compared with a prior art, the method is economical and minimizes substrate defects.

Second, because a high-precision production process is unnecessary as compared with the prior art, the process may be rapidly performed.

Third, the smear phenomenon can be minimized.

While the invention has been particularly shown and described herein with reference to preferred embodiments thereof, it will be understood by those skilled in the art that various modifications and changes may be made to the instant invention utilizing the principles of the invention as described herein without departing from the spirit and scope thereof as encompassed in the accompanying claims. Therefore, it is intended in the accompanying claims to cover all such equivalent variations as come within the scope of the invention as described.

What is claimed is:

1. A structure of a CCD image sensor comprising:
   an n-type semiconductor substrate;
   a p-type epitaxial layer formed on the n-type substrate;
   an n-type photodiode and an n-type BCCD enclosed by said p-type epitaxial layer on sides and bottoms of said n-type BCCD, except for surfaces of said n-type BCCD;
   a transfer poly gate for connecting said photodiode and said BCCD, formed over said epitaxial layer;
   a poly gate electrode for applying a clock signal to said n-type BCCD, connected to sad transfer poly gate and formed over said BCCD;
   an n-type region for controlling OFD voltage and being disposed between aid substrate and said epitaxial layer beneath said photodiode;
   a p-type region for reducing smear noises, disposed between said n-type substrate and said p-type epitaxial layer beneath said BCCD, said p-type region having a higher concentration than said p-type epitaxial region; and
   a low potential barrier formed in a flat portion in the surface of the substrate between the n-type region and the p-type region;
   wherein, said p-type region and said n-type region are formed at a designated interval in a horizontal direction.

* * * * *